United States Patent
Shen

[19]

[11] Patent Number: 5,923,986
[45] Date of Patent: Jul. 13, 1999

[54] METHOD OF FORMING A WIDE UPPER TOP SPACER TO PREVENT SALICIDE BRIDGE

[75] Inventor: Yun-Hung Shen, Taipei, Taiwan

[73] Assignee: Taiwan Semiconductor Manufacturing Company, Ltd., Hsin-Chu, Taiwan

[21] Appl. No.: 09/156,055

[22] Filed: Sep. 17, 1998

[51] Int. Cl.[6] .................................................. H01L 21/336
[52] U.S. Cl. ......................... 438/303; 438/305; 438/595
[58] Field of Search ................................... 438/303, 595, 438/263, 264, 301, 305, 306, 366, 583, 649, 664

[56] References Cited

U.S. PATENT DOCUMENTS

| | | | |
|---|---|---|---|
| 5,093,275 | 3/1992 | Tasch, Jr. et al. | 438/303 |
| 5,674,774 | 10/1997 | Pasch et al. | 438/305 |
| 5,693,550 | 12/1997 | Torii | 438/303 |
| 5,710,450 | 1/1998 | Chau et al. | 438/303 |
| 5,780,348 | 7/1998 | Lin et al. | 438/303 |
| 5,789,298 | 8/1998 | Gardner et al. | 438/303 |
| 5,840,609 | 11/1998 | Hyeon et al. | 438/303 |
| 5,846,857 | 12/1998 | Ju | 438/303 |

*Primary Examiner*—Charles Bowers
*Assistant Examiner*—Jack Chen
*Attorney, Agent, or Firm*—George O. Saile; Stephen B. Ackerman; William J. Stoffel

[57] ABSTRACT

A method of forming a wide top spacer (50 20S 40A) that prevents salicide bridging. The wide top spacer (50) consists of a first spacer (20S) and an upper spacer (40A) (half spacer). The upper spacer (40A) is formed by covering the first spacer with a sacrificial layer (30) and forming the upper spacer (40A) on a top portion of the first spacer. During a subsequent salicide process, the upper spacer (40A) prevents sputtered metal (60) from forming of an area (51) on the first spacer under the upper spacer (40A). This prevents shorting between the S/D (12) and the gate (18).

17 Claims, 3 Drawing Sheets

METHOD OF FORMING A WIDE UPPER TOP SPACER TO PREVENT SALICIDE BRIDGE

BACKGROUND OF THE INVENTION

1) Field of the Invention

This invention relates generally to fabrication of semiconductor devices and more particularly to the formation of spacers on gate structures for Salicide processes For CMOS semiconductor devices.

2) Description of the Prior Art

The Complementary Metal Oxide Semiconductor (CMOS) technology has been recognized as the leading technology for use in digital electronics in general and for use in many computer products in particular. This is because the Integrated Circuits (IC) formed on silicon wafers using CMOS technology have high density, operate at high speed and have a low standby power consumption. Despite these advantages the CMOS technology has been associated with high sheet resistance in the source and drain regions of the transistors as well the polysilicon films frequently used to form the gate regions. This high sheet resistance is detrimental to the basic operations of the CMOS device, such as the speed and power consumption.

Self-aligned siliceded (SALICIDE) metal oxide semiconductor techniques are frequently used to reduce the sheet resistance of a CMOS device thereby improving speed characteristics of the device. In this technique, a thin film of metal such as Titanium (Ti), Cobalt (Co) etc., is reacted with the source, drain and Polysilicon regions under specified conditions. The thin film of metal is reacted with the silicon to form a layer of silicide. Thus, titanium is reacted with silicon to form Titanium Silicide (TiSi2). The silicide layer has a lower sheet than the sheet resistance of silicon. During the manufacturing process, a silicide layer when formed at a low temperature prevents the formation of a silicide layer over silicon dioxide or silicon nitride. Further, the unreacted metal film formed over oxide or silicon nitride can be etched using chemicals wet agents without adversely affecting the silicide formed in the polysilicon and silicon regions.

To prevent electrical shorting of adjacent silicide region i.e., the source, gate and drain regions, Prior art processes use oxide (Silicon Dioxide-SiO2) spacers to isolate these regions.

Although this technique shows the advantages of self-aligning and of low resistance of gate and source/drain in MOS technology, many problems still exist because shorter spaces and shallower junctions are needed to properly scale down the devices. If the length of sidewall oxide is to be reduced, isolating the gate and source/drain regions during the silicidation process becomes extremely difficult because of the lateral diffusion of the silicon and the metal along the sidewall oxide. This will result in shorting of gate and source/drain areas. It will be understood that the limit on the length of spacer is dependent on the temperature of metal/silicon reaction and the thickness of the metal film deposited. The problem is especially severe for MOS devices using LDD structures with the self-aligned silicidation of the gate and source/drain regions.

The importance of overcoming the various deficiencies noted above with the bridging and shorting in the salicide process is evidenced by the extensive technological development directed to the subject, as documented by the relevant patent and technical literature. The following patents show various methods for forming double spacers.

U.S. Pat. No. 4,912,061 (Nasr): Method of forming a salicided self-aligned metal oxide semiconductor device using a disposable silicon nitride spacer—shows a double spacers (oxide and nitride)on the sidewalls of a gate. The fabrication of the device is accomplished in seven major steps: First, on a substrate having an oxide layer, an undoped polysilicon layer defining the gate region is deposited. Second, an oxide layer is grown and then a silicon nitride layer is deposited. Third, the oxide and the silicon nitride layers are selectively etched, leaving the oxide and the nitride layers on the walls of the polysilicon gate region. However, this structure does not solve the problem of shorting between the S/D and gate in salicide processes.

U.S. Pat. No. 5,663,586 (Lin) shows an FET device with double spacer.

U.S. Pat. No. 5,208,472 (Su) Double spacer salicide MOS device and method —shows multilayer dielectrics used at the edge of the gate electrode, and the gate electrode, the source and the drain have metal silicide regions.

SUMMARY OF THE INVENTION

It is an object of the present invention to provide a method for fabricating a wide top spacer for a salicide process that reduces the salicide bridging and shorting.

It is an object of the present invention to provide a "one and a half" spacer process to form a "wide top spacer" 50 that reduces silicide bridging in salicide processes.

To accomplish the above objectives, the present invention provides a method of forming a "top wide spacer" 50 (20S 40A) that prevents salicide bridging. The top wide spacer 50 consists of a first spacer 20S and an upper spacer 40A (half spacer). See FIG. 5. The upper spacer 40A is formed by covering the first spacer with a sacrificial layer 30 and forming the upper spacer 40A on an top portion of the first spacer. See FIGS. 3 and 4. During a subsequent salicide process, the upper spacer 40A prevents metal 60 from forming on an area 51 on the first spacer under the upper spacer 40A. See FIG. 6. This prevents shorting between the S/D 12 and Gate 18.

In more detail, the method includes the following steps. A first spacer 20S is formed on the sidewalls of the gate structure 14 18. Next, we form a sacrificial layer 30 covering the gate structure 14 18. The sacrificial layer 30 is etched back to expose a top portion of the first spacer 20S. A second insulating layer 40 is formed over the first spacer 20S. The second insulating layer 40 is etched back to form an upper spacer 40A on sidewalls of the first spacer; the first spacer and the upper spacer form a wide top spacer 50 (20S 40A). The first portion of the sacrificial layer 30 is removed. A salicide process is started by forming metal layer over the substrate. The substrate is heated forming a suicide regions over the gate and source /drains. The unreacted metal layer 60 is removed thereby forming a salicide structure. The top wide spacer 50 prevent metal bridging between the source/drain areas and the top of the gate structure 14 18.

BENEFITS OF THE INVENTION

The wide top spacer of the present invention reduces salicide bridging. The metal atoms 60 can not sputter on to the underneath 51 of the edge of the upper spacer 40A, which gains a larger window against the salicide bridge. See FIG. 6. The metal atoms can't sputter under the upper spacer on area 51.

It is important to realize that in contrast to the prior art's Double spacers, the invention forms a "one and a half spacer" (1.5 spacer) 20S & 40A. The invention's wide top spacer 20S 40A (1.5 spacer) is better than a double spacer because the invention's half spacer 40A prevents metal 60 from forming along the entire spacer surface (e.g., not on area 51) between the S/D and gate.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a invention relates to techniques for forming self-aligned semiconductor devices and components for integrated circuits. More particularly, the invention relates to a method of forming a self-aligned metal oxide semiconductor field effect transistor (MOSFET) having low junction leakage and a low percentage of shorting between the gate and the source/drain regions. The method uses two dielectric layers on the edge of the gate structure 14 18. The first layer forms a first sidewall spacer 20S. The second layer forms a second spacer (Upper spacer 40A) on the upper shoulder of the first spacer 20S. The upper spacer 40A functions as an extended spacer to isolate the subsequently formed silicided regions (e.g., source, drain and gate). This technique forms a novel wide top spacer 50 (e.g., one and a half spacer 50) self-aligned silicide MOS structure useful for high density very large scale integrated (VLSI) circuit technology.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

A Substrate 10 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

Figure 1:
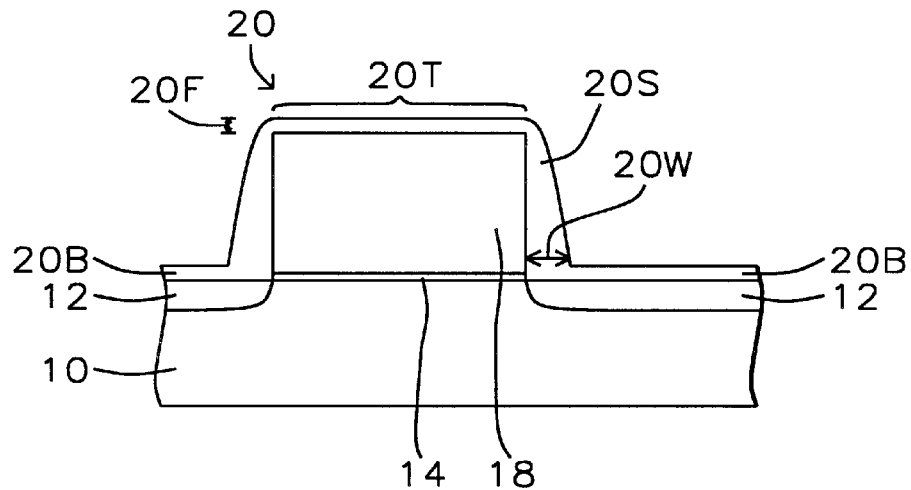
FIGS. 1,2 3, 4, 5, 6 and 7 are cross sectional views for illustrating a method for manufacturing a wide top spacer for a salicide process according to the present invention.

FIG. 1 shows forming a gate structure 14 18 on a substrate 10. The gate structure 14 18 has a top and sidewalls. The substrate 10 having source/drain areas 12 adjacent to the gate structure.

The gate structure preferably comprises a gate oxide layer 14 having a thickness in a range of between about 50 and 60 Å and an overlying conductive (e.g., polysilicon) layer 18 having a thickness in a range of between about 1950 and 2050 Å. Other configurations of the gate structure are possible, such as where the conductive layer is formed of more than one conductive layers.

Next, lightly doped source and drain regions 12 are formed in the substrate 10 adjacent to the gate structures.

Still referring to FIG. 1, a first insulating layer 20 is formed over the gate structure 14 18. The first insulating layer 20 is preferably composed of silicon oxide, silicon oxynitride (SiON), and silicon nitride and more preferably silicon nitride.

Still referring to FIG. 1, the first insulating layer is etched back forming a top insulating layer 20T over the top of the gate structure 14 18 and forming a first spacer 20S on the sidewalls of the gate structure 14 18 and forming a bottom insulating layer 20B on the substrate.

The first spacer 20S has sidewalls. The sidewalls of the first spacer 50 have upper areas above a lower area. The upper area will be above a subsequently formed sacrificial layer 30. See FIG. 4.

The top insulating layer 20T and the bottom layers 20B are preferred but optional layers. If the subsequently formed sacrificial layer 30 is doped, layers 20B and 20T prevent the doping from diffusing into the substrate and gate.

The top insulating layer 20T and bottom insulating layers 20B preferably have a thickness in a range of between about 200 and 500 Å.

The first spacer 50 preferably has a bottom width 20 W in a range of between about 1200 and 1300 Å.

A sacrificial layer 30 is then formed over the substrate and covering the gate structure 14 18. The sacrificial layer 30 preferably has a thickness in a range of between about 2000 and 3000 Å. The sacrificial layer is preferably composed of spin-on-glass, phosphosilicate glass (PSG), or silicon oxide; and is more preferably composed of phosphosilicate glass (PSG). If the spacer 50 is composed of silicon nitride (SiN), the sacrificial layer 30 is preferably spinon-glass or PSG. If the spacer 50 is composed of oxide or Silicon oxynitride, then the sacrificial layer is preferably low K (dielectric constant) material (e.g., polymer.)

Figure 2:
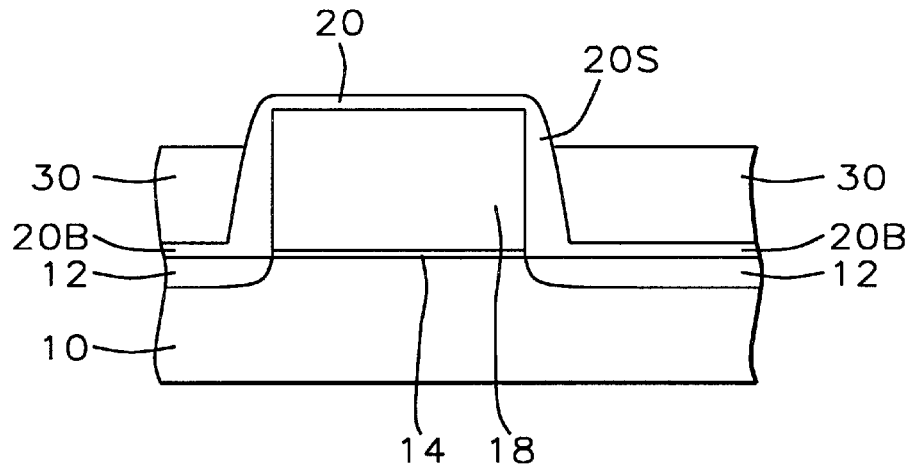

FIG. 2 shows the etching back of the sacrificial layer 30 to expose an upper portion of the first spacer, leaving a first portion of the sacrificial layer 30 over the substrate and adjacent to the first spacer 20S. The sacrificial layer 30 is etched back with a wet or dry etch. The first portion of the sacrificial layer preferably has a thickness 30H in a range of between about 1000 and 1200 Å.

Figure 3:
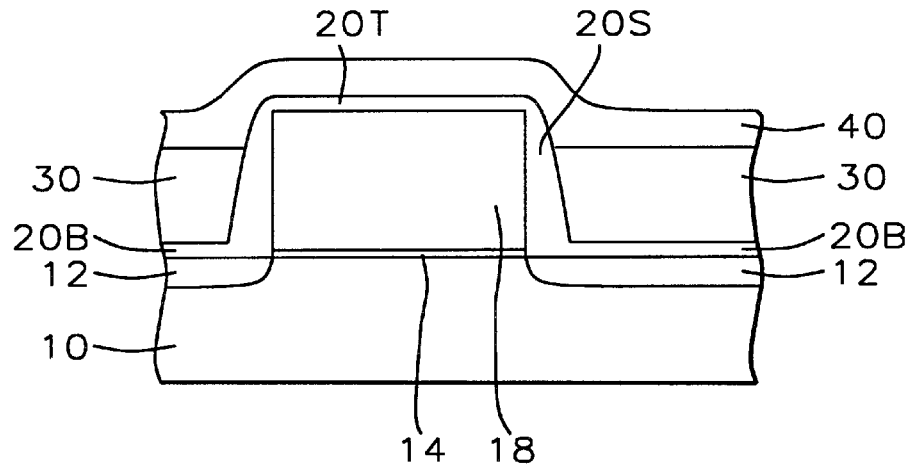

FIG. 3 shows forming a second insulating layer 40 over the gate structure 14 18, the first spacer 20S and the sacrificial layer 30.

The second insulating layer 40 is preferably composed of oxide formed by TEOS, $SiO_2$, Silicon oxynitride, or silicon nitride; and is most preferably composed of SiN. The second insulating layer preferably has a thickness in a range of between about 500 and 1000 Å.

Figure 4:
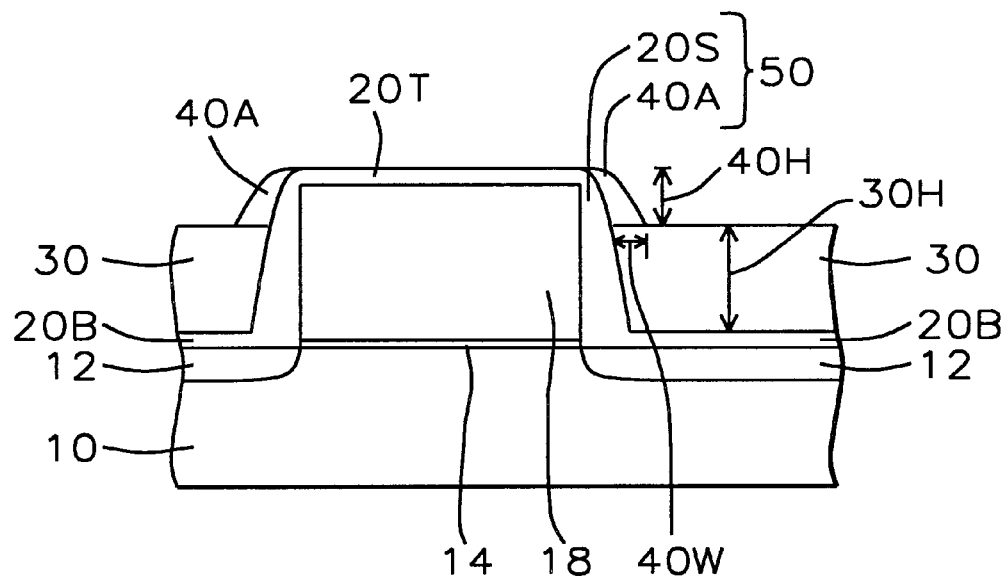

FIG. 4 shows etching back the second insulating layer 40 forming the novel upper spacer 40A on sidewalls of the first spacer. The upper spacer has a top and a bottom. The first spacer and the upper spacer comprise a "wide top spacer" 50.

The upper spacer 40A preferably has a height 40H in a range of between about 200 and 800 Å. The upper spacer 40A preferably has a width 40W at the bottom in a range of between about 100 and 600 Å. These dimensions have be found to prevent metal bridging.

The upper spacer 40A and the first spacer 20S preferably are composed of the same material.

Figure 5:
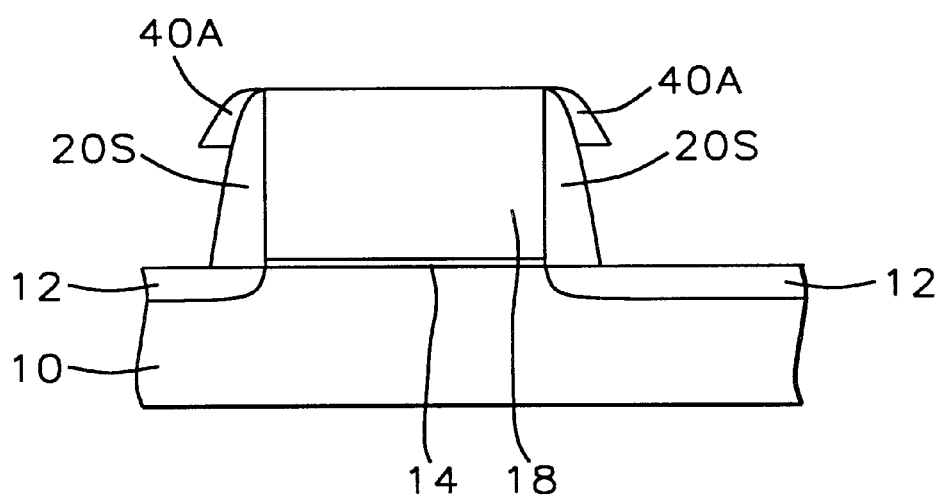

FIG. 5 shows removing the first portion of the sacrificial layer 30. The sacrificial layer composed of PSG, or SOG is preferably etched back with HF or buffered oxide etch (BOE). The sacrificial layer composed of low –K material is preferably etched back with $O_2$.

Next, source/drain regions 13 are formed adjacent to the first spacers.

Figure 6:
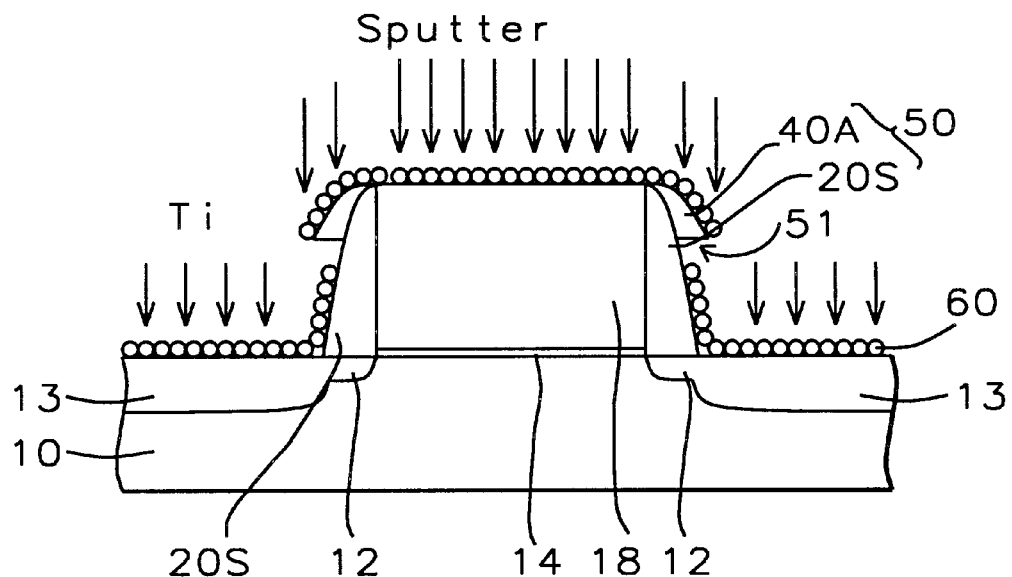

Next, the salicide process is performed. FIG. 6 shows forming a metal layer over the substrate. The metal layer is preferably composed of Co and titanium and is most preferably composed of Ti. The metal layer is preferable deposited using a collimaitive sputter process which is directional as shown in FIG. 6. It is hard to deposit metal in the area 51 on the first spacer underneath the upper spacers. 40A.

Figure 7:
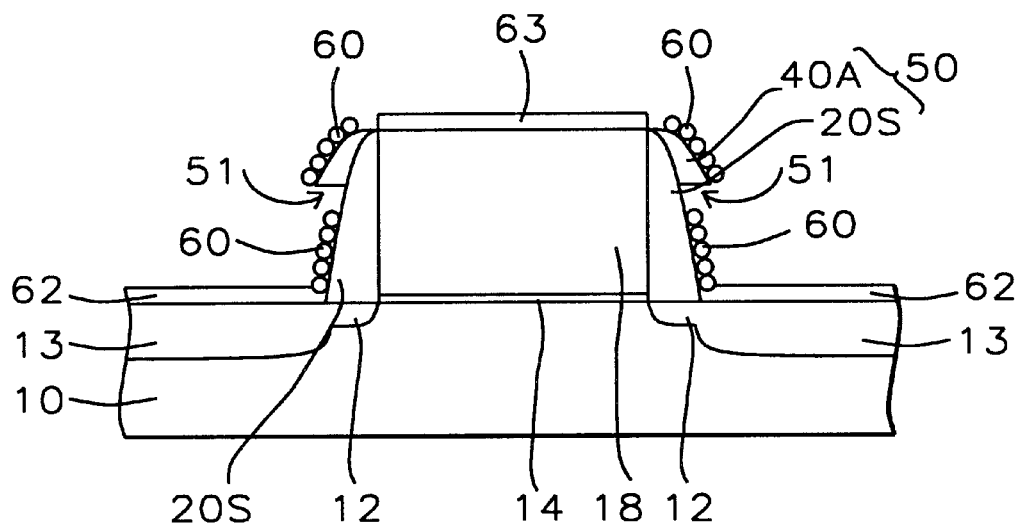

FIG. 7 shows heating the substrate forming a first silicide region 62 over the source and drain regions 13 and a silicide gate contact 63 on the gate 18. Note the unreacted metal 60 on the spacers 40A and 20S and no metal on area 51.

Next, the unreacted metal layer is removed from over the top wide spacer 50 thereby forming a salicide structure. The top wide spacer 50 prevent metal bridging between the source/drain areas and the top of the gate structure 14 18.

Next, the unreacted metal 60 is removed thereby forming the salicide structure. The wide top spacer 50 prevents metal bridging between the S/D regions 12 and the top of the gate structure 14 18. The upper spacer 40A prevents metal and/or silicide from forming in the area 51 under the upper spacer 40A.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a top spacer having a upper spacer on a gate structure; comprising the steps of:
   a) forming a gate structure on a substrate; said gate structure having a top and sidewalls; said substrate having source/drain areas adjacent to said gate structure;
   b) forming a first spacer on said sidewalls of said gate structure; said first spacer having sidewalls;
   c) forming a sacrificial layer over said substrate; said sidewalls of said first spacer having a upper area above said sacrificial layer;
   d) forming a first insulating layer over said gate structure, said first spacer and said sacrificial layer;
   e) etching back said first insulating layer to form an upper spacer on sidewalls of said first spacer; said upper spacer having a top and a bottom; said first spacer and said upper spacer comprise a top spacer;
   f) removing said sacrificial layer;
   g) forming a metal layer over said substrate; portions of said first spacer, said upper spacer and said top of said gate structure;
   h) heating said substrate to form a first silicide region over said source/drain areas and a gate silicide contact on said gate structure; and leaving an unreacted metal layer over said first space and said upper spacer;
   i) removing the unreacted metal layer thereby forming a salicide structure whereby said top spacer prevents metal bridging between said source/drain areas and said top of said gate structure.

2. The method of claim 1 wherein said gate structure comprises a gate oxide layer having a thickness in a range of between about 50 and 60 Å and an overlying conductive layer composed of polysilicon having a thickness in a range of between about 1950 and 2050 Å.

3. The method of claim 1 wherein said first spacer and said upper spacer are composed of silicon nitride and said sacrificial layer is composed of spin-on-glass or phosphosilicate glass (PSG).

4. The method of claim 1 wherein said first spacer and said upper spacer is composed of a silicon oxide or silicon oxynitride and said sacrificial layer is composed of a low K material.

5. The method of claim 1 wherein said first spacer has a bottom width in a range of between about 1200 and 1300 Å and said upper spacer having a height in a range of between about 200 and 800 Å; and said upper spacer has a width at said bottom in a range of between about 100 and 600 Å.

6. The method of claim 1 wherein said first insulating layer is composed of a material selected from the group consisting of oxide formed using TEOS, Silicon oxynitride, and silicon nitride; and said first insulating layer having a thickness in a range of between about 500 and 1000 Å.

7. The method of claim 1 wherein said metal layer composed of a material selected from the group consisting of Co, and titanium.

8. The method of claim 1 wherein said sacrificial layer having a thickness in a range of between about 1000 and 1200 Å and said sacrificial layer composed of a material selected from the group consisting of phosphosilicate glass (PSG), low k-material, and silicon oxide.

9. A method of fabrication of a top spacer having a upper spacer on a gate structure comprising the steps of:
   a) forming a gate structure on a substrate; said gate structure having a top and sidewalls; said substrate having source/drain areas adjacent to said gate structure;
   b) forming lightly doped source/drains in said substrate adjacent to said gate structure;
   c) forming a first insulating layer over said gate structure;
   d) etching back said first insulating layer to form a top insulating layer over said top of said gate structure and forming a first spacer on said sidewalls of said gate structure and forming a bottom insulating layer on said substrate; said first spacer having sidewalls;
   e) forming a sacrificial layer over said substrate and covering said gate structure;
   f) etching back said sacrificial layer leaving a first portion of said sacrificial layer over said substrate and adjacent to said first spacer; said sidewalls of said first spacer having a upper area above said sacrificial layer;

g) forming a second insulating layer over said gate structure, said first spacer and said sacrificial layer;

h) etching back said second insulating layer to form an upper spacer on sidewalls of said first spacer; said upper spacer having a top and a bottom; said first spacer and said upper spacer forming a top spacer;

i) removing said first portion of said sacrificial layer;

j) forming source/drain region in said source/drain areas;

k) sputtering a metal layer over said substrate; over portions of said first spacer, over said upper spacer and said gate structure;

l) heating said substrate to form a first silicide region over said source and drain areas and a gate silicide contact on said gate structure; and leaving an unreacted metal over said first spacer and said upper spacer;

m) removing the unreacted metal layer thereby forming a salicide structure whereby said top spacer prevents metal bridging between said source/drain areas and said top of said gate structure.

10. The method of claim 9 wherein said upper spacer having a height in a range of between about 200 and 800 Å; and said upper spacer having a width at said bottom in a range of between about 100 and 600 Å.

11. The method of claims wherein said gate structure comprises a gate oxide layer having a thickness in a range of between about 50 and 60 Å and an overlying conductive layer composed of polysilicon having a thickness in a range of between about 1950 and 2050 Å.

12. The method of claim 9 wherein said top insulating layer having a thickness in a range of between about 200 and 500 Å.

13. The method of claim 9 wherein said first spacer having a bottom width in a range of between about 1200 and 1300 Å.

14. The method of claim 9 wherein said sacrificial layer having a thickness in a range of between about 2000 and 3000 Å and said sacrificial layer composed of a material selected from the group consisting of phosphosilicate glass (PSG), low k-material, and silicon oxide.

15. The method of claim 9 wherein said first portion of said sacrificial layer has a thickness in a range of between about 1000 and 1200 Å.

16. The method of claim 9 wherein said second insulating layer is composed of a material selected from the group consisting of oxide formed by TEOS, silicon oxynitride, and silicon nitride.

17. A method of fabrication of a top spacer having a upper spacer on a gate structure; comprising the steps of:

a) forming a gate structure on a substrate; said gate structure having a top and sidewalls; said substrate having source/drain areas adjacent to said gate structure;

b) forming lightly doped source/drains in said substrate adjacent to said gate structure;

c) forming a first insulating layer over said gate structure;
   (1) said first insulating layer is composed of a material selected from the group consisting of silicon oxide, silicon oxynitride (SiON) and silicon nitride;

d) etching back said first insulating layer to form a top insulating layer over said top of said gate structure and forming a first spacer on said sidewalls of said gate structure and forming a bottom insulating layer on said structure; said first spacer having sidewalls;
   (1) said first spacer having a bottom width in a range of between about 1200 and 1300 Å;

e) forming a sacrificial layer over said substrate and covering said gate structure;

f) etching back said sacrificial layer leaving a first portion of said sacrificial layer over said substrate and adjacent to said first spacer; said sidewalls of said first spacer having a upper area above said sacrificial layer;

g) forming a second insulating layer over said gate structure, said first spacer and said sacrificial layer;

h) etching back said second insulating layer to form an upper spacer on sidewalls of said first spacer; said upper spacer having a top and a bottom; said first spacer and said upper spacer forming a top spacer;
   (1) said upper spacer having a height in a range of between about 200 and 800 Å; and said upper spacer having a width at said bottom in a range of between about 100 and 600 Å;

i) removing said first portion of said sacrificial layer;

j) forming source/drain region in said source/drain areas;

k) sputtering a metal layer over said substrate; over portions of said first spacer, over said upper spacer and said gate structure;

l) heating said substrate to form a first silicide region over said source and drain areas and a gate silicide contact on said gate structure; and leaving an unreacted metal over said first spacer and said upper spacer;

m) removing the unreacted metal layer thereby forming a salicide structure whereby said top spacer prevents metal bridging between said source/drain areas and said top of said gate structure.

\* \* \* \* \*